United States Patent [19]
Printz et al.

[11] Patent Number: 5,594,674
[45] Date of Patent: Jan. 14, 1997

[54] CODE POINT UPDATE DEVICE IN THE ARITHMETIC CODING METHOD

[75] Inventors: Harry W. Printz, New York, N.Y.; Peter R. Stubley, Outremont, Canada

[73] Assignee: Digital Equipment Corporation, Maynard, Mass.

[21] Appl. No.: 549,467

[22] Filed: Oct. 27, 1995

Related U.S. Application Data

[63] Continuation of Ser. No. 216,743, Mar. 23, 1994, abandoned.

[30]    Foreign Application Priority Data

Mar. 29, 1993  [FR]  France .................... 93 03589

[51]  Int. Cl.$^6$ ................................... H03M 7/30
[52]  U.S. Cl. .............. 364/715.02; 382/247; 341/107
[58]  Field of Search ................ 364/715.02; 341/107; 382/56, 247

[56]            References Cited

U.S. PATENT DOCUMENTS

| | | | |
|---|---|---|---|
| 4,286,256 | 8/1981 | Langdon, Jr. et al. | 341/107 |
| 4,467,317 | 8/1984 | Langdon, Jr. et al. | 341/107 |
| 4,891,643 | 1/1990 | Mitchell et al. | 341/107 |
| 4,989,000 | 1/1991 | Chevion et al. | 341/107 |
| 5,313,204 | 5/1994 | Semasa et al. | 341/107 |

OTHER PUBLICATIONS

Thompson et al. "Digital Arithmetic Units", Radio and Electronic Engineer, vol. 45, No. 3, Mar. 1975, London GB, pp. 116–120.

*Primary Examiner*—David H. Malzahn
*Attorney, Agent, or Firm*—Joanne N. Pappas; Denis G. Maloney; Arthur W. Fisher

[57]            ABSTRACT

In a lossless compression algorithm, the left most point of a current interval, i.e., the code point is updated by using a code point updating device which handles inputs identified by R and X, and uses two registers. The first of the two register is an interval width register, and the second is a code point register. The updating device comprises a grid of n×n cells chosen from four basic component cells, i.e., (i) above diagonal cells designated "ad" and located above the principal diagonal of the grid, (ii) diagonal cells designated "d" and located on the principal diagonal, incorporating and adder (31) and a multiplexer (30) and at least one register (32);

(iii) a single cell designated "fd" for "final diagonal", located at the bottom end of the diagonal and incorporating an adder (31) a multiplexer (30) and at least one register (32), and (iv) output retiming cells designated "or", incorporating a register (35).

9 Claims, 14 Drawing Sheets

| SYMBOL | DEVICE |
|---|---|
| ▫ | REGISTER, 32, 34-39 |
| ⏢ | ADDER 31 |
| ▽ | MULTIPLEXER, 30 OR 33 |

*Fig. 6a*

CODE POINT UPDATE DEVICE IN THE ARITHMETIC CODING METHOD

This application is a continuation of application Ser. No. 08/216,743 filed Mar. 23, 1994 now abandoned.

DESCRIPTION

Priority of application Ser. No. 93-03589 filed on Mar. 29, 1993 in France is claimed under 35 U.S.C. §119.

1. Technical Field

The present invention relates to a code point update device in the arithmetic coding method.

2. Prior Art

GENERAL EXPLANATION OF ARITHMETIC CODING

As described in the article by Glen G. Langdon, Junior entitled "An Introduction to Arithmetic Coding" (IBM Journal of Research and Development, 28(2), pp. 135–149, March 1984), arithmetic coding is a well known lossless data compression method.

Arithmetic coding establishes a correspondence between a sequence of symbols and an interval of real numbers. The starting point is the interval [0,1]. When each symbol is coded, the current interval is replaced by a subinterval thereof. After coding a sequence of symbols, the original sequence can be exactly reconstructed, no matter what the given point in the current interval.

In this type of coding it is conventional practice to store the leftmost point of the interval as the result, the value obtained being called the code point.

This coding algorithm is recursire. For each symbol to be coded, the algorithm divides the current interval as a function of occurrence probabilities and the order given by the list of symbols which can be coded. The algorithm then replaces the current interval by the subinterval corresponding to the symbol to be coded. This procedure is repeated for the number of times which is necessary for coding a given sequence.

MATHEMATICAL EXPLANATION OF ARITHMETIC CODING

Up to now a geometrical explanation has been given of arithmetic coding. Reference is made to intervals and their subdivision. For implementation in a computer, it is necessary to explain the method using numerical quantities and this explanation will now be given.

In the following description the following notations are adopted:

| | |
|---|---|
| $S = \{s^0, s^1 \ldots, s^{N-1}\}$ | set of codable N symbols |
| $S_i$ | symbol to be coded in stage i |
| $P(S_i)$ | symbol occurrence probability |
| $P(S_i)$ | cumulative symbol probability |
| $A_i$ | current interval width |
| | range of admissible values of $A_i$ |
| $X_i$ | shift for representing $p(S_i).A_i$ in |
| $X_{max}$ | maximum possible value of $X_i$ |
| $R_i$ | augend of $P(S_i).A_i$ |
| $C_i$ | value of current code point (location of leftmost point of interval) |
| $\zeta_i$ | as $C_i + R_i$ unshifted |
| $B_i$ | $1+X_i$ output bits |
| $T_k$ | fixed width bit block. |

As previously explained, in each stage the coder state is given by a subinterval of [0,1]. The process for coding a symbol consists of replacing the current interval by a subinterval of itself.

For representing the current interval in a computer, two arithmetic quantities are updated, mainly $C_i$, the left-most point of the interval, and $A_i$ the interval width. Thus, for each stage the actual interval is $[C_i, C_i + A_i]$.

Thus, the process given hereinbefore for coding a symbol is expressed by the following equations:

$$A_{i+1} = p(S_i) \cdot A_i \quad (1)$$

$$C_{i+1} = C_i + P(S_i) \cdot A_i \quad (2)$$

in which $p(S_i)$ is the modellized probability of the symbol $S_i$ and $P(S_i)$ is the sum of the probabilities of all the symbols preceding $S_i$ in the list of the source alphabet $$P(s^k) = \sum_{j<k} P(S^j)$$

These equations arithmetically represent the same subdivision and selection procedure described above. The first relates to the recurrence of the interval width and the second to the recurrence of the code point.

EXPLANATION OF THE FINITE PRECISION ALGORITHM FOR ARITHMETIC CODING

These equations assume an infinite precision arithmetic. For carrying out arithmetic coding on finite precision arithmetic operations, use is made of the approach of Frank Rubin in an article entitled "Arithmetic Stream Coding Using Fixed Precision Registers" (IEEE Transactions an Information Theory, IT-25(6), pp. 672–675, November 1979). The number of bits used for representing each of the $S_i, R_i, A_i, C_i, B_i, p(S_i)$ and $P(S_i)$ is fixed, said quantities being designated by #s, #R, #A, #C, #B, #p and #P. It should be noted that #P=#p. The range $R=[\alpha, 2\alpha]$, in which $\alpha>0$ of the admissible interval widths is also chosen. It is ensured that $Ai \in R$ always applies and for this purpose the following operations are performed in each stage of coding:

1. Obtain $p(S_i)$ and $P(S_i)$, exactly compute $p(S_i) \cdot A_i$.
2. Determine the shift $X_i$ such that $p(S_i) \cdot A_i \cdot 2^{X_i} \in R$.
3. Find the lower approximation on #A bits closest to $p(S_i) \cdot A_i \cdot 2^{X_i}$, which gives $A_{i+1}$.
4. Exactly compute $R_i = P(S_i) \cdot A_i$.
5. Exactly compute $\zeta_i = C_i + R_i$.
6. Emit the carry-out and $X_i$ most significant bits of $\zeta_i$, which forms the variable width block $B_i$.

It should be noted that the definitions of the quantities the algorithm determine certain length relations:

- by cumulative probability definition #P=#p,
- by stages 1 and 2, $X_{max}$=#p,
- by stage 4, #R=#P+#A=#p+#A,
- by stage 6, #B=1+$X_{max}$=1+#p (the width of $B_i$s is variable, but a large number of bits is required for representing the longest possible value of $B_i$),
- by stage 7, #C=#R=#p+#A.

Thus, the parameters #p and #A determine the length of all the other quantities in these equations.

Thus an explanation has been given as to how the sequence of variable width blocks $B_i$ is produced by the algorithm. Each block contains $1+X_i$ bits, consisting of the carry-out and $X_i$ most significant bits of the sum $\zeta = C_i + R_i$. These variable length blocks can be assembled in a sequence of fixed length blocks $T_k$. The sequence of blocks $T_k$ constitutes the output coding flow. The assembly process is performed by 8 standard method, which does not concern us in the remainder of the present document.

It is possible to summarize stages 1 to 7 of the finite precision algorithm given above by the following equations:

$$(A_{i+1}, X_i, R_i) = f(S_i, A_i) \quad (3)$$

$$(C_{i+1}, B_i) = g(C_i, R_i, X_i) \quad (4)$$

The function $f$ effects stages 1 to 4 and the function $g$ stages 5 to 7 given above.

EXPLANATION OF THE CODE POINT UPDATE PRIOR ART

The updating of the code point $C_i$ is described by the above equation (4). FIG. 5 shows the structure of a unit able to perform this equation. $C_i$ is the present code point. $R_i$ is the product $P(s_i) \cdot A_i$ and $X_i$ is the shift value. Both are obtained from the interval width update unit (not shown in this drawing). The adder 19 computes the sum $c_i = R_i + C_i$. The shifter 20 removes the carry bit from this sum and the $X_i$ most significant bits, which become the quantity $B_i$ and shifts the remaining bits by $X_i$ and which then become the new value of $C_i$.

Taking account of the loop existing in the unit of FIG. 5 and which passes from the register 14 across the adder, the shifter and then again to the register 14, the clock period $\tau$ of a circuit following this arrangement must satisfy the inequation $$\tau > \tau_{cary}(\#C) + \tau_{shift}(X_{max}) \quad (5)$$

if (5) is not respected, there is a risk of recording an incorrect value for a few bits of $C_i$. In this case $\tau_{cary}(n)$ is the time necessary for the propagation of the carry over across a n bit adder and $\tau_{shift}(m)$ is the time necessary for the passage of the resulting sum through a structure, which can carry out a shift able to reach m bits (as designated above $\#C$ is equal to $\#A + \#p$ and $X_{max}$ is equal to $\#p$).

There are two well known methods for speeding up the synchronous digital logic, like that of FIG. 5, namely retiming and table lookup. It will be demonstrated that they cannot be used here.

Due to the existence of this loop, it is not possible to use the retiming technique as described in an article by Charles E. Leiserson and James B. Saxe entitled "Retiming ynchronous Circuitry", Algorithmica, 6(1), pp. 5–35, 1991, to said circuit.

Moreover, the implementation of this unit by a table lookup requires $(1 + X_{max} + \#C) \cdot 2^{\#R + \#C + \#X}$ memory bits. For usable values of these parameters, e.g. $\#C = \#R = 16$, $X_{max} = 12$ and $\#X = 4$, it would be necessary to have 232 GBytes, which is an excessive value for practical applications.

However, the value $\#p$ should be as high as possible for the following reason. Two conditions are necessary to enable our compression system to compress its input stream. Firstly the probability distribution of the symbols must be non-uniform. In addition, said non-uniformity must be reflected in the probability values used for the computation. The probabilities $p(si)$ and $P(si)$ are real numbers taken from the interval of [0,1], which can require an infinite precision in order to accurately represent everything. The computed quantities are binary finite representations of these values, each written with $\#p$ bits.

Obviously there is no control on the content of the input stream. However, given a favourable distribution, in order to exploit it it must be possible to represent the numbers just below 1, as well as those just above 0. It is therefore desirable to have $\#p$ as high as possible, so as to be able to represent the widest possible probability range. However, according to equation (5), the higher $\#p$, the slower the circuit. It is therefore necessary to find a compromise between a fast circuit with mediocre compression and an effective compressor at reduced speed.

The invention offers a solution to this problem. It is a device for the construction of code point update units able to operate at high speed and independent of the size of the operands. The parameter $\#p$ can be taken as high as desired, without any negative consequence for the compression speed.

DESCRIPTION OF THE INVENTION

The present invention relates to a code point update device of an arithmetic coding system, characterized in that for maintaining a given number of precision bits, whilst maintaining a fixed number of logic levels between two registers, said device comprises a grid of n×n cells taken from among four basic cells:

$n(n-1)/2$ cells ad, above the principal diagonal of the grid, incorporating a multiplexer (33), $n-1$ cells d, on said principal diagonal incorporating an adder (31) and a multiplexer (30) and at least one register (32), a cell fd at the bottom end of the diagonal incorporating an adder (31), a multiplexer (30) and at least one register (32), $n(n-1)/2$ output retiming cells or incorporating a register (35), the lower limit of the clock period being such that $$\tau > \max\{\tau_{mux} + \tau_{add}, X_{max} \cdot \tau_{prop}\}$$

$\tau_{mux}$, $\tau_{add}$ being the setting up times of the multiplexers and adders, $\tau_{prop}$ the time lag necessary to enable a signal to propagate through the width of a cell and $X_{max}$ the maximum shift.

In an advantageous embodiment, the adders are generalized adders each incorporating $j+k+l$ input bits and which generate $l+k$ output bits, in which j, k and l are non-negative integers and whose equations giving the outputs as a function of the inputs are completely arbitrary.

In a variant, the code point update device of an arithmetic coding system according to the invention comprises a grid of $(2n-1)n$ cells taken from among six basic cells:

$n(n-1)/2$ input retiming cells ir incorporating two registers, $n-1$ diagonal cells d incorporating an adder and a multiplexer, a cell fd at the lower end of the diagonal incorporating an adder and a multiplexer, $n-1$ cells fad located above the diagonal in the left-hand column of the grid and incorporating a multiplexer, $(n-2)(n-1)/2$ cells ad located above the diagonal and incorporating a multiplexer, $n(n-1)$ output retiming cells or incorporating a register, the lower limit of the period being such that $$\tau > \max\{\tau_{mux} + \tau_{add}, \tau'_{prop}\}$$

in which $\tau_{mux}$, $\tau_{add}$ are the setting times of the multiplexers and adders, in which $\tau'_{prop}$ is the propagation time of a signal along any random wire.

In an advantageous embodiment the adders are generalized adders each incorporating j+k+l input bits and which generate l+k output bits, in which j, k and l are non-negative integers.

The invention makes it possible to improve the efficiency of coding non-adaptive arrangements for high speed arithmetic coding by proposing and advantageous design of the code point update circuit.

The present invention permits a higher data compression speed than the known arithmetic coding technique described in the article by Glen G. Langdon referred to hereinbefore and the article by Ian H. Witten, Radford M. Neal and John G. Cleary entitled "Arithmetic Coding for Data Compression" (Communications of the ACM, 30(6), pp. 520–540, June 1987). It can constitute the basis of a product used for data compression. This product could be used for the compression of data to be transmitted on a communication channel or for recording in a file system.

BRIEF DESCRIPTION OF THE DRAWINGS

FIG. 6a is a key of devices in FIGS. 6–17.

FIG. 1 shows the architecture of a prior art arithmetic coder for coding the symbol $s_i$. It comprises an interval width update unit 10, a code point update unit 11 and optionally a buffer circuit 12.

Figure 1:
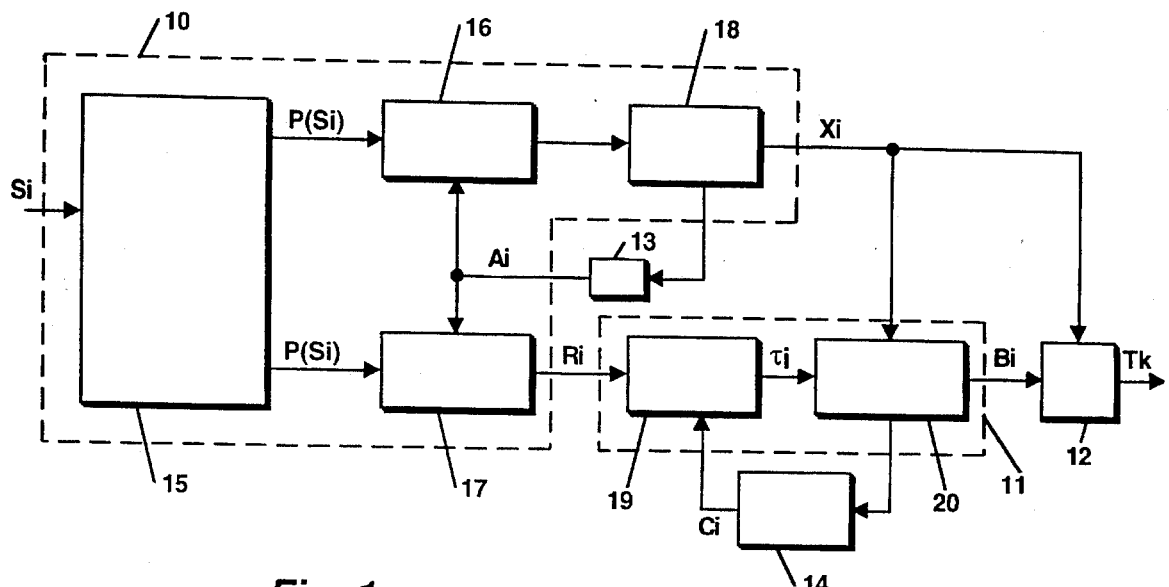
FIG. 1 shows the architecture of a prior art arithmetic code including a prior art code point update unit.

The interval width update unit 10 supplies two signals $X_i$ and $R_i$ to the code point update unit 11. An output of the unit 10 connected to a register 13 makes it possible to supply to one input of said module the signal $A_i$. An output of the unit 11 connected to a register 14 makes it possible to supply $C_i$ to another input of the module 11. The buffer circuit 12 receives on its two inputs the signals from the code point update unit 11, namely $X_i$ and $B_i$, in order to supply a signal $T_k$.

The interval width update unit 10 makes it possible to update $A_i$ in the register 13. For each stage of the algorithm it takes a new symbol $s_i$ and the current value of the register 13. It generates the augend $R_i$, the shift $X_i$ and the new value $A_i$ for the register. It therefore keeps updated the current interval width $A_i$. The code point update unit 11 also updates $C_i$ in the register 14. For each stage it takes into account the shift $X_i$, the augend $R_i$ and the current value of the register 14 by producing a new value for $R_i$ and a variable length block $B_i$ of width l+$X_i$. The value $X_i$ is not modified.

The variable block buffer circuit 12 assembles the sequence of variable length blocks in the fixed length blocks $T_k$, which constitute the output of the coder.

The prior art interval width update unit 10 shown in FIG. 1 comprises a probability computation module 15, whose two outputs supplying the signals $p(S_i)$ and $P(S_i)$ are respectively connected to a first multiplier 16 followed by a standardization module 18 for supplying the signal $X_i$ and to a second multiplier 17 supplying signal $R_i$. An output of the standardization module 18 is connected to an input of each multiplier 16 and 17 across the register 13.

The code point update unit 11 comprises an adder 19, which receives on a first input the signal $R_i$, connected to a shift circuit 20 receiving on another input the signal $X_i$ and whereof a first output is relooped on a second input of the adder 19 across a register 14, a second output of the shift circuit 20 supplying a signal $B_i$.

The buffer circuit 12 comprises an adder receiving on its two inputs the output signals from the interval width update unit 10 and the code point update unit 11, namely $X_i$ and $B_i$, for supplying the signal $T_k$.

The algorithm for the arithmetic coding must maintain a quantity designated by the code point $C_i$. Whenever a symbol is coded, the current code point must be incremented and optionally shifted. The shifted bits are emitted in the output stream and become the new value of the code point. FIG. 1 shows the elements of a circuit 11 maintaining the code point. This circuit performs the following algorithm:

1. Exact computation of $\zeta_i C_i + P(s_i) \cdot A_i$
2. Emission of the carry and the $X_i$ most significant bits of $\zeta_i$
3. Shifting by $X_i$ positions the remaining bits of $\zeta_i$, the result being $C_i$+1.

In this case $C_i$ is the current code point, $A_i$ the current interval width, $s_i$ the following symbol to be coded, $P(s_i)$ its cumulative probability and $X_i$ the shift. $R_i$ is written for the product $P(s_i) \cdot A_i$. The quantities $X_i$ and $R_i$ are obtained from the interval width update.

Figure 5:
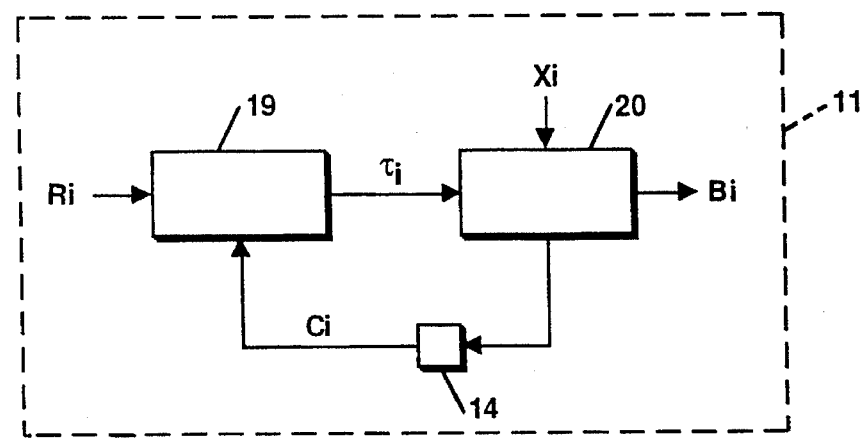
FIG. 5 shows a prior art version of a code point update unit.

A description will now be given of the invention and its operating principles. The invention relates to the code point update unit 11 of FIG. 1. FIG. 5 separately shows this part of FIG. 1.

The essence of the invention is a device permitting the application of transformation by retiming to the unit of FIG. 5. As explained hereinbefore, in the prior art it is not possible to apply said transformation to the unit. However, it is advantageously possible to apply this transformation twice, firefly for eliminating long combinational logic chains and secondly for eliminating long wires. The first stage is referred to as "logic retiming" and the second as "wire retiming".

Figure 2:
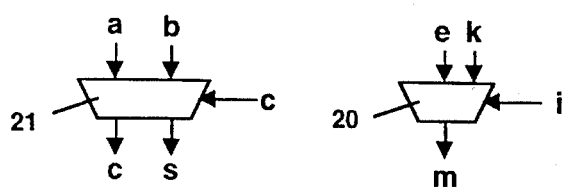
FIG. 2 shows a prior art adder.

The structure of digital circuits will now be given. The elements of these circuits are shown in FIG. 2 and are:

a full adder 21, whose outputs comply with the relations $s = a \oplus b \oplus C_{in}$ and $C_{out} = ab + bC_{in} + aC_{in}$ with a and b being input values, $C_{in}$ the input carry and $C_{out}$ the output carry, a multiplexer or mux 22, whose output m complies with the relation m=it+−ie, with i, t, and e input values.

In this case the symbol ⊕ represents the "exclusive-OR" logic aperation, the symbol + represents the "inclusive-OR" logic operation, the symbol − represents the logic negation operation and the juxtaposition of variables represents the logic "AND" operation. In addition, a square symbol indicates a register, which delays its input by a clock stroke.

In the drawings an unrepresented input will be considered as transmitting a zero signal.

Figure 3:
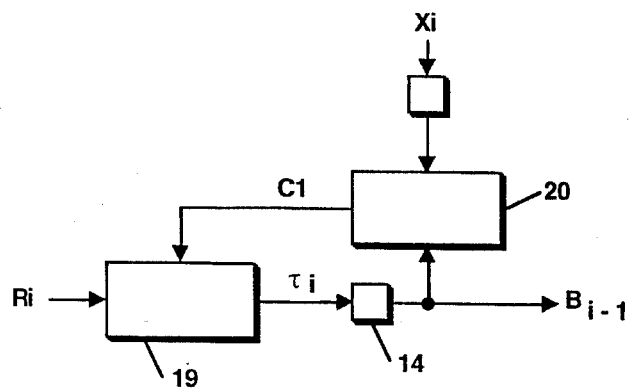
FIG. 3 shows a prior art device for making a selection of a particular width for the circuit.

The first stage of the invention is to transform it to obtain the version of FIG. 3. The register 14 has been shifted in the loop, but this has no effect on the low limit of the clock cycle τ given in equation (5). In the cycle where $R_i$ and $X_i$ are introduced on the inputs, the register contains the quantity $\zeta_i = C_i + R_i$.

Figure 4:
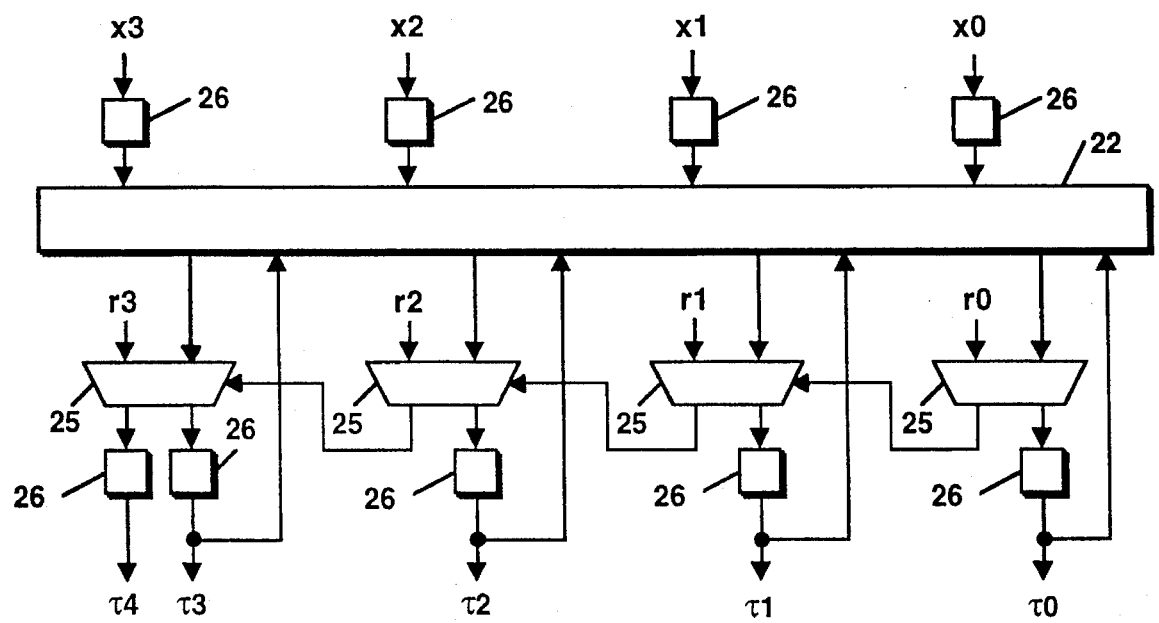
FIG. 4 shows a prior art circuit wherein for a chosen width of the circuit (4 bits) an output is introduced into the adder.

On more particularly considering FIG. 3, a selection made of a particular width for the circuit (in this case 4 bits) and it is introduced into the adder structure. The carry over construction is used for the adder. The shifter is supplied with a unitary representation, i.e. a set of $X_{max}$ wires ( . . . $x_2$ $x_1$ $x_0$), which are all at zero, with the exception of $X_u$, in which u is the shift quantity. In the considered example $X_{max}=4$. The result is given in FIG. 4. Therefore the invention relates to a novel circuit integrating the desired addition, shift and recording functions and which can be synchronized at a frequency independent of #C and $X_{max}$.

Figure 6:
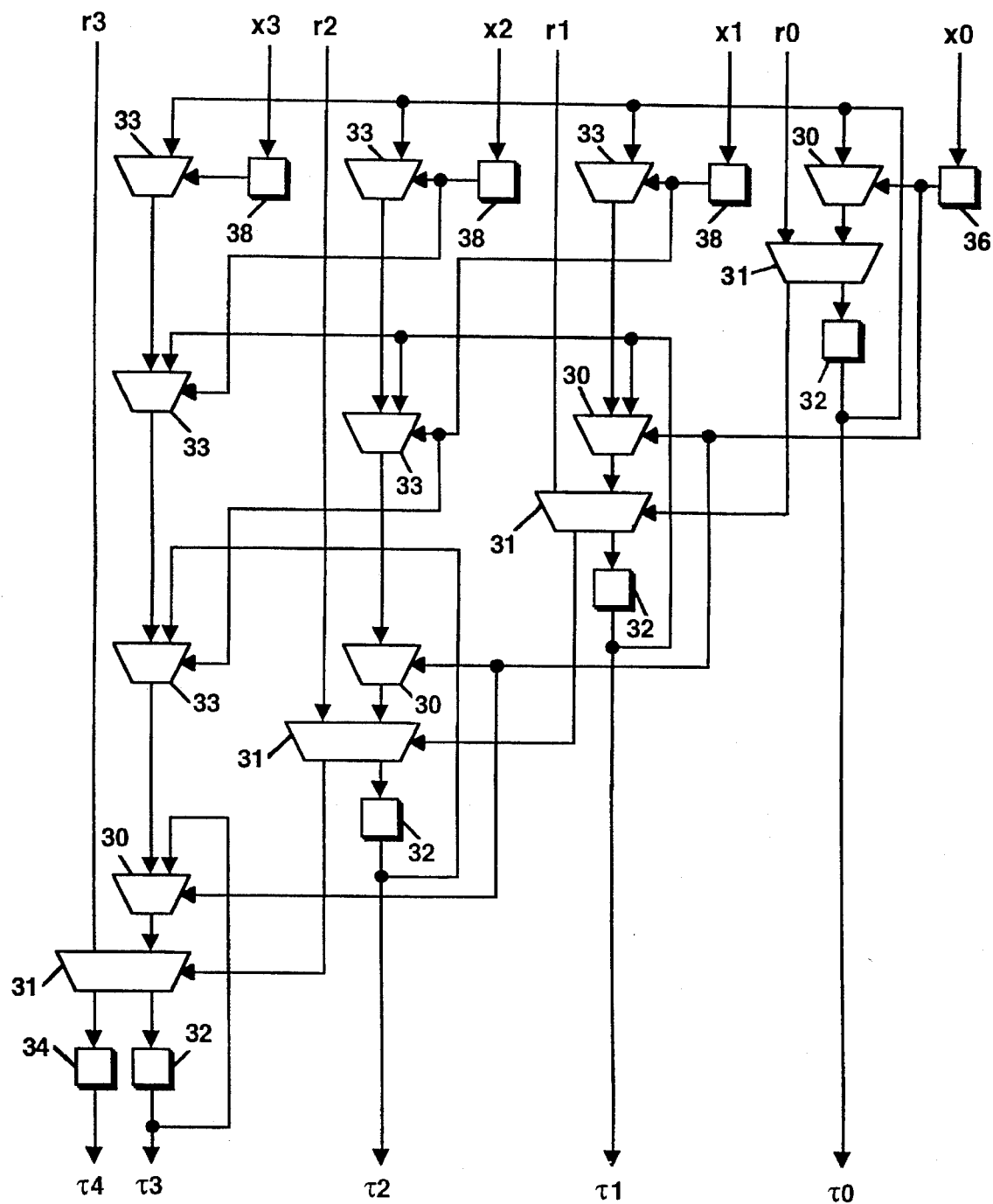
FIG. 6 shows an embodiment of the invention showing logic elements placed along the diagonal of a square.

It is now possible to explain the invention. This is dependent on a detailed device of the mixed adder—shifter unit given here. The invention consists of placing the logic elements along the diagonal of a square and to construct the device according to the invention for phase shifting thereon. This is shown in FIG. 6. A unitary representation of $X_i$ is considered, in such a way that the shifter has a simple structure. However, this does not limit the generality of our invention, as is it is obvious to pass from a binary to a unitary notation. This is possible because the carry propagation direction and the direction of any shift are the same.

Two observations can be made: firsfly each loop in the drawing only has two logic stages. It is true that there are longer combinatory paths in the drawing such as the carry propagation chain. However, the second observation is that these long chains can be subdivided by retiming. This is what is referred to hereinbefore as logic retiming.

Figure 7:
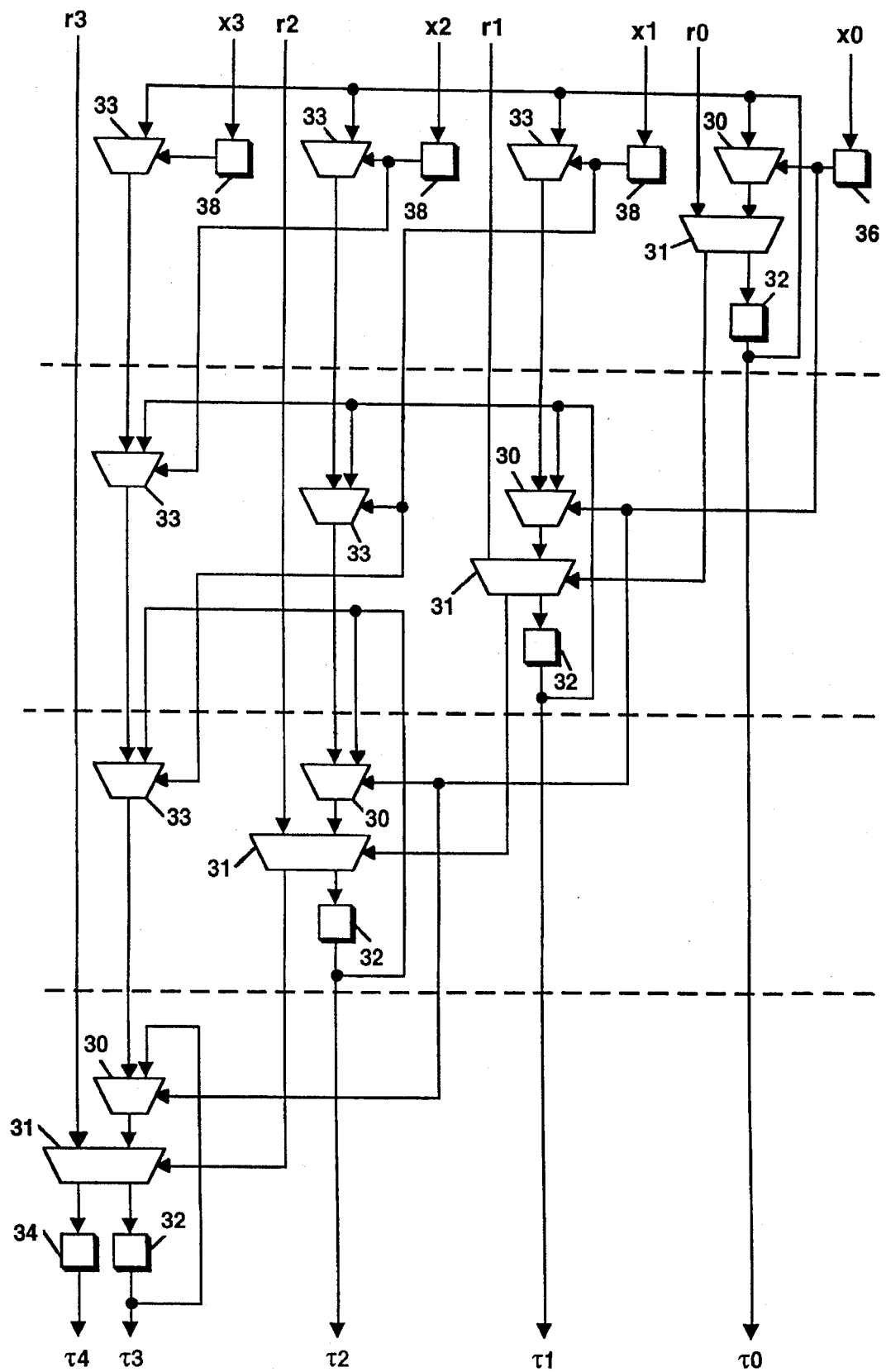
FIG. 7 shows how retiming can be carried out.

FIG. 7 explains how such a retiming can be carried out. The horizontal dotted lines representing the retiming limits indicate the locations where the registers must be introduced. This retiming is possible due to the uniform direction of the information flow through these lines.

Figure 8:
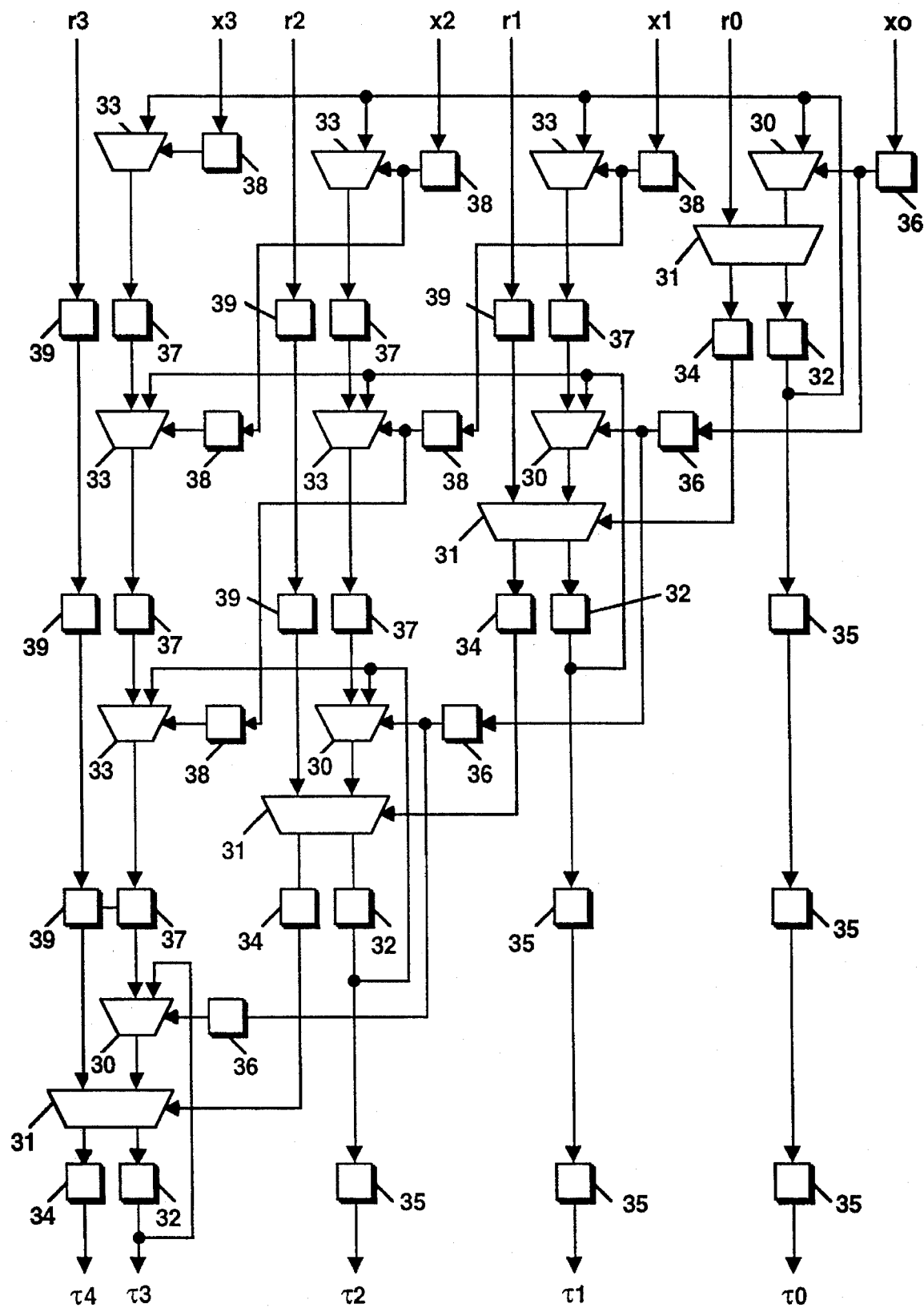
FIG. 8 shows a retimed circuit by way of example.

FIG. 8 shows the retimed circuit (after displacing some of these registers for facilitating the drawing). In this case the elements 30 or 33 are multiplexers, 31 are full adders and 32, 34, 35, 36, 37, 38 and 39 are registers.

The essential characteristic resulting from this is that there are no longer two logic stages between two random registers. The lower limit of the clock period is $$\tau > \max\{\tau_{mux} + \tau_{add}, X_{max} \cdot \tau_{prop}\} \quad (6)$$

In this expression $\tau_{mux}$ and $\tau_{add}$ are setting times for the multiplexer and the full adder of FIG. 2, whilst $\tau_{prop}$ is the propagation time for a signal through a cell, said quantity being very low.

Figure 9:
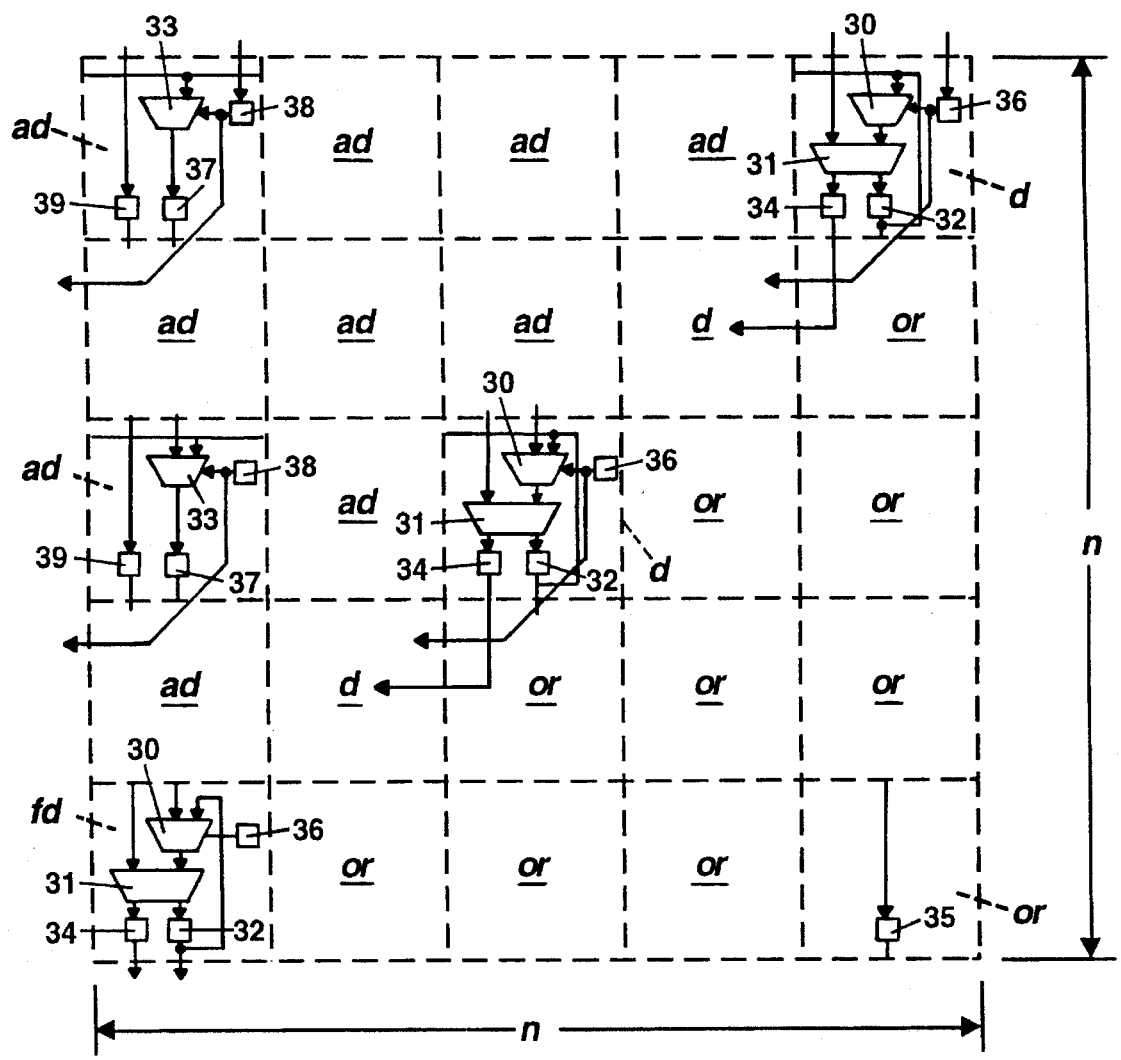
FIG. 9 shows the circuit of FIG. 8 having a width of n bits.

The structure of FIG. 8 can be extended to the general case of a circuit with a width of n bits, as shown in FIG. 9. This gives the example of the case n=5. There are several unconnected wires which can be ignored and which emanate from cells located on the left-hand edge of the grid.

Such a circuit of random size can be assembled by forming a grid n×n with four basic cells. Thus, a grid contains a total of $n^2$ cells distributed in the following way:

| Number of Cells | Type of Cell |
| --- | --- |
| n(n−1)/2 | above the diagonal or (ad) |
| n−1 | within the diagonal, or (d) |
| 1 | bottom end of the diagonal, or (fd) |
| n(n−1)/2 | output retiming, or (or). |

Figure 10:
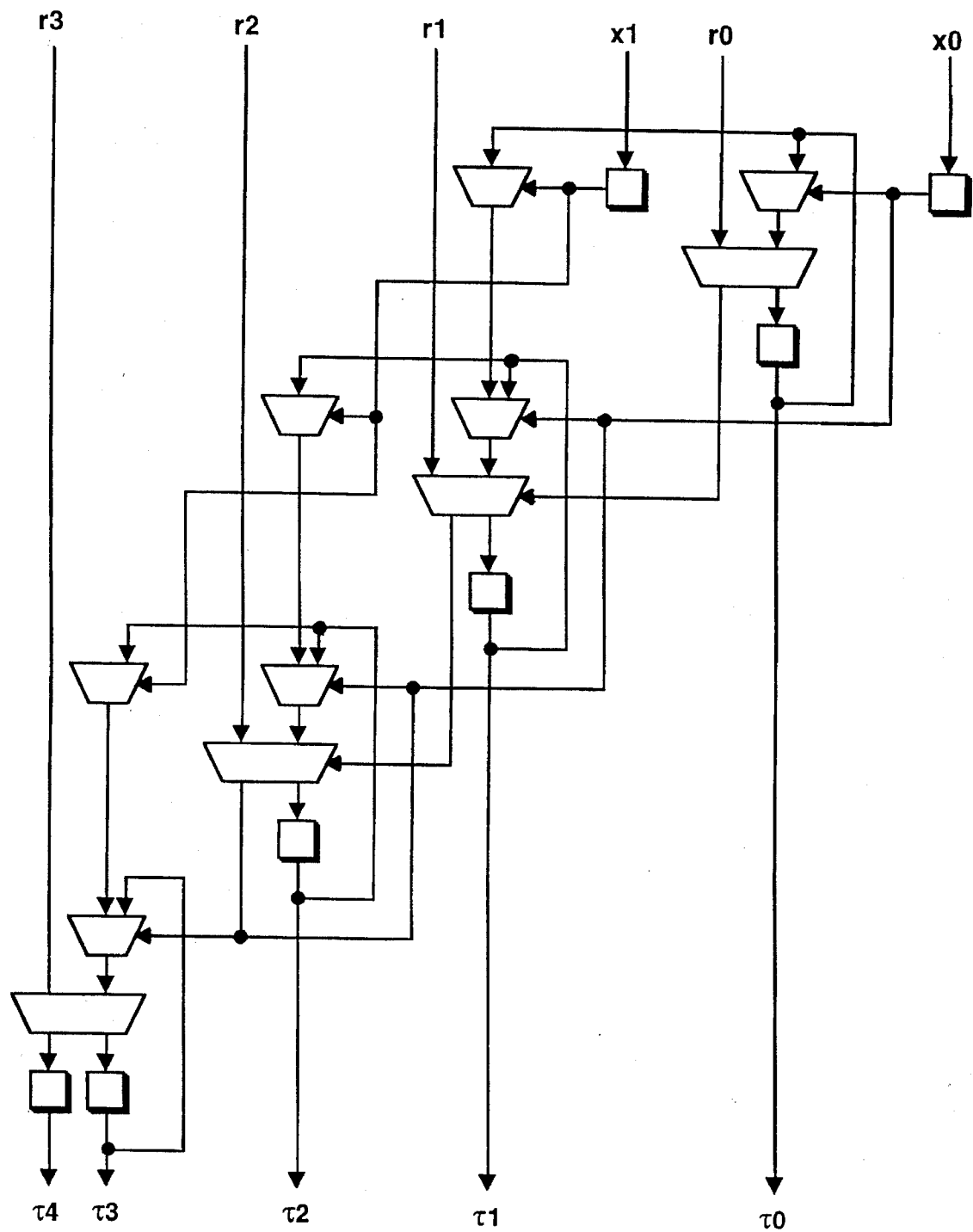
FIG. 10 corresponds to the inventive version of FIG. 4.

Up to now consideration has been given to $X_{max}=n$, which is the width of the circuit. This is the most general possible supposition, because a shift of more than n bits means that no bit of the register $\zeta_i$ will be restored to circulation and in this case the computation proceeds as if all the bits were 0. This effect can be obtained in the circuits by placing each bit of the unitary representation of $X_i$ at 0. However, the case $X_{max}<n$ is possible and allows a slight circuit simplification. The bits $x_u$ are then eliminated from the unitary representation with $u>X_{max}$, together with the registers and multiplexers which they supply. FIG. 10 illustrates the code point update circuit for the case n=4 and $X_{max}=2$. This circuit can be retimed like that of FIG. 8 in order to obtain a rapid version.

ELIMINATION OF LONG TRANSMISSION PATHS

The length of the logic chains in all the tiles of the circuit shown in FIG. 9 is limited to two. However, the large tiles of this circuit with a high value for $X_{max}$ contain long transmission paths. In particular the wire which passes out of the least significant adder must extend $X_{max}$ columns to the left-hand end of the circuit. This gives the term $X_{max} \cdot \tau_{prop}$ in the expression (6) for the lower limit of τ.

However, by adding supplementary registers and modifying the circuit geometry, it is possible to eliminate this disadvantage. This is what is referred to hereinbefore as retiming of the wires.

Figure 11:
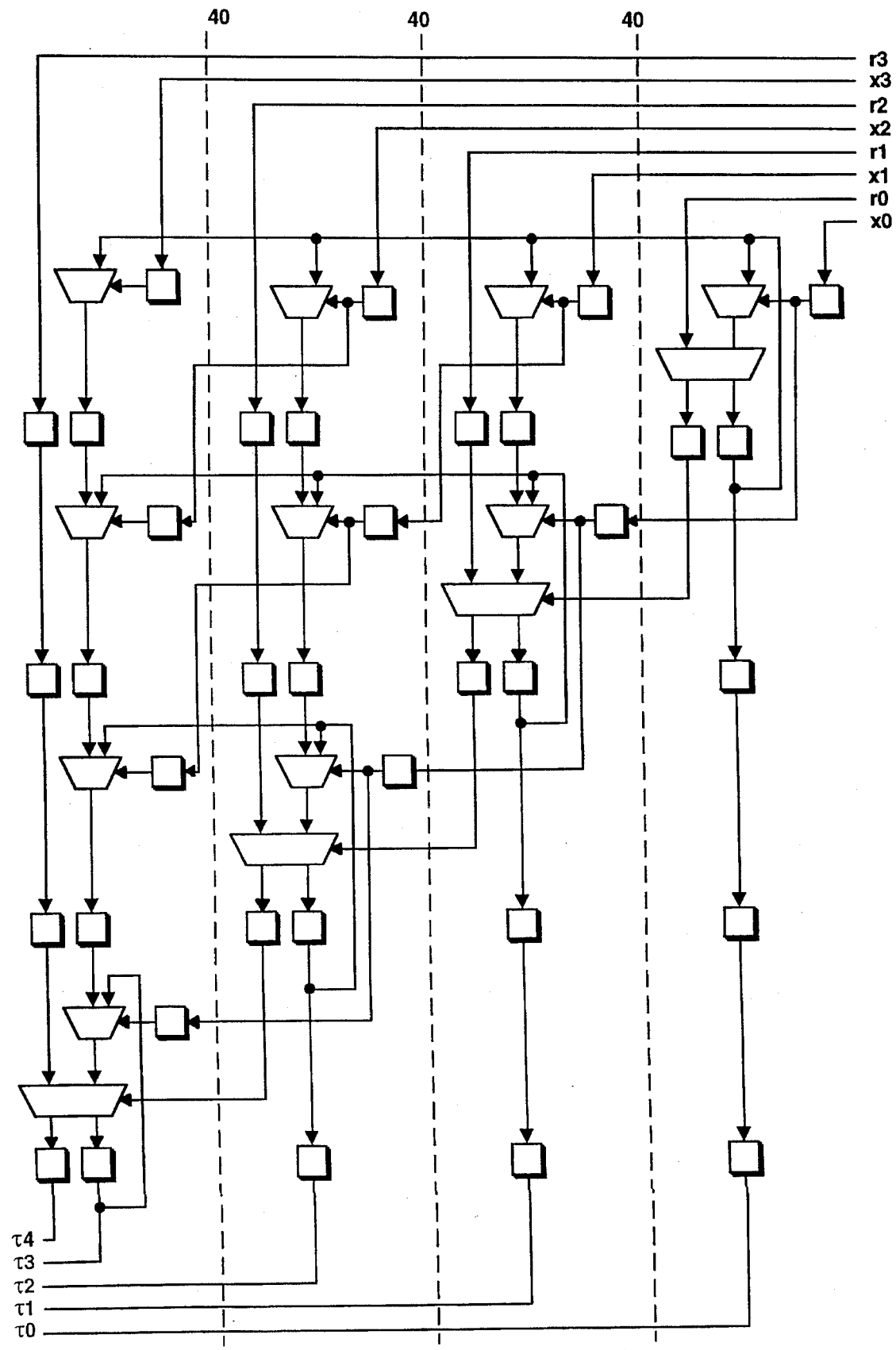
FIG. 11 shows a code point update circuit for retiming.
Figure 12:
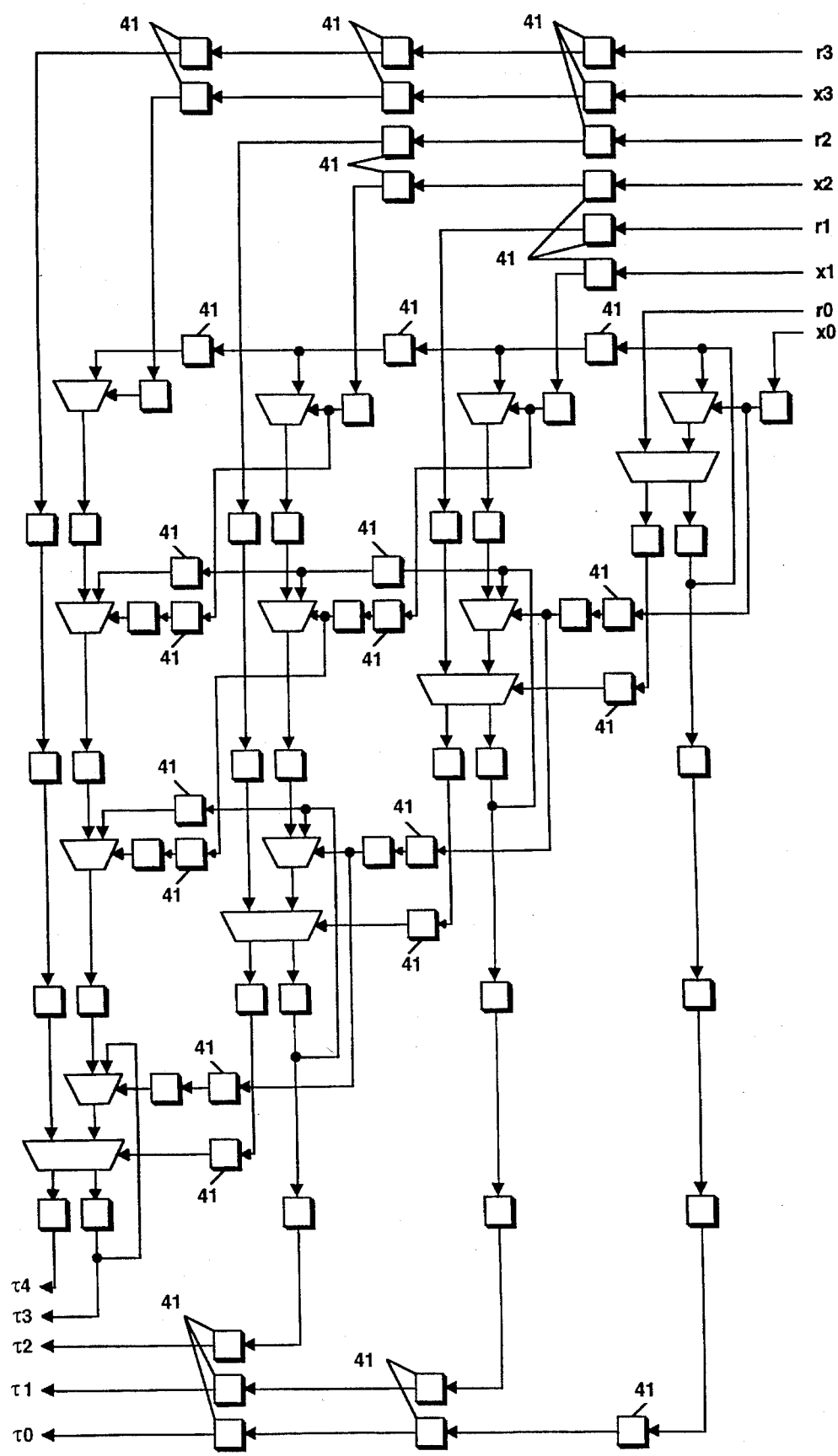
FIGS. 12 and 13 show variants of a code point update circuit after retiming.
Figure 13:
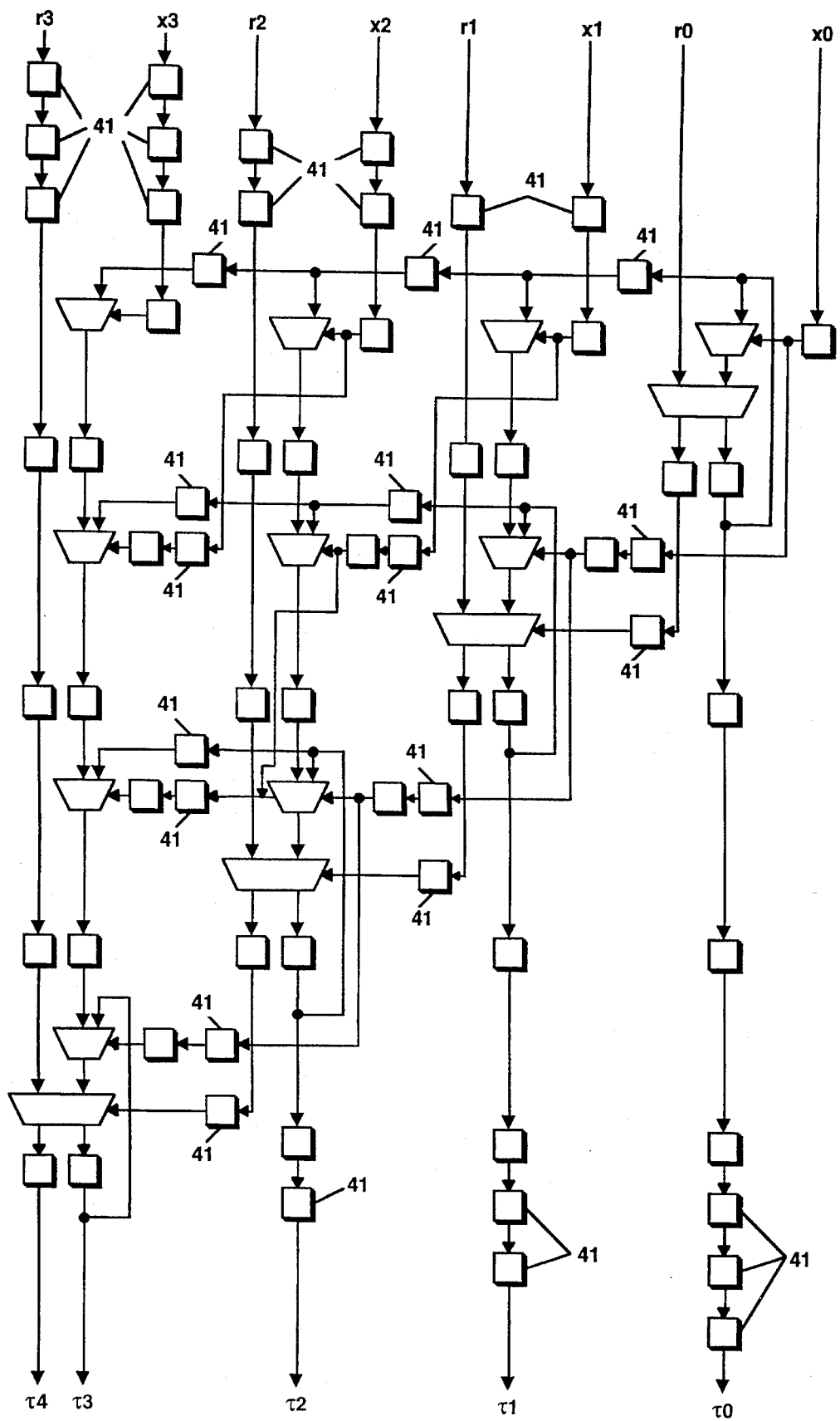
Figure 14:
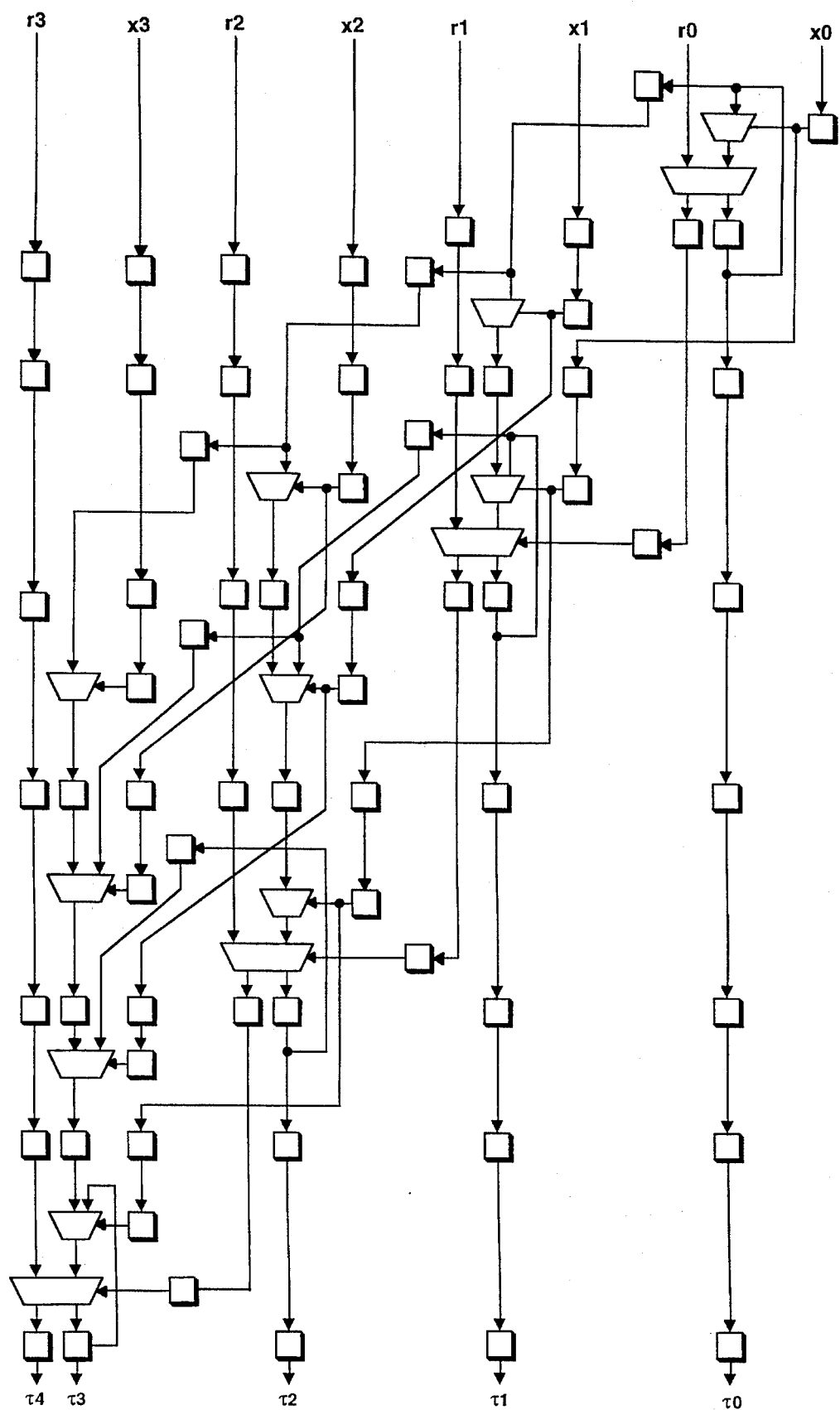
FIG. 14 shows a code point update circuit after retiming.

FIGS. 11, 12 and 13 illustrate the modification process and FIG. 14 is an example of the final version of the circuit.

FIG. 11 shows a code point update circuit for retiming. This circuit is topologically identical to that of FIG. 8. The inputs and outputs have merely been repositioned. The vertical dotted lines 40 indicate where it is necessary to retime the circuit. Such a modification makes it possible to subdivide the long horizontal paths into segments of limited length.

FIG. 12 shows a code point update circuit after retiming. FIG. 12 is identical to FIG. 11 with a register 41 inserted at the locations where a wire crosses a retiming limit. The long horizontal paths have been subdivided, but the wires top left and bottom right are of linear length n. By adding registers for cutting certain paths, other paths, which were previously short, were lengthened. A solution to this problem will now be described.

FIG. 13 is a code point update circuit after retiming. This variant of the previous drawing has input and output retiming registers in their respective columns. The wires supplying the most significant bit at the input and the most significant bit at the output are of linear length n.

FIG. 14 is a code point update circuit with constant wire lengths. This version is obtained by shifting each column of the circuit of FIG. 13 by a given quantity with respect to the adjacent column. All the wires now have a limited length. In addition, this limit is independent of the width of the bits n of the circuit.

Figure 15:
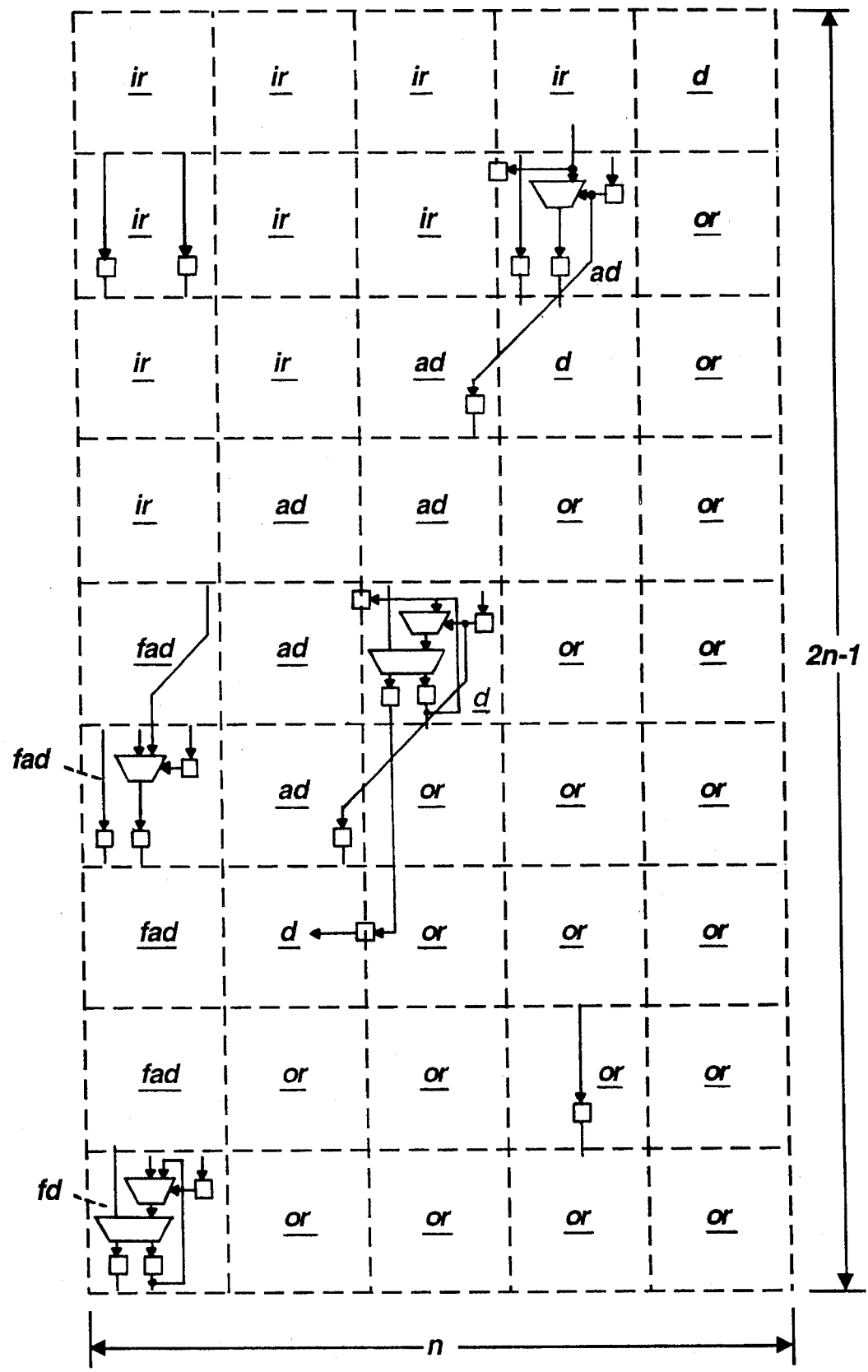
FIG. 15 shows how to construct a version of the arbitrary width circuit by forming a grid of size nx(2n−1).

As previously it is possible to construct versions of this arbitrary width circuit by forming a grid of size n×(2n−1) with the basic cells illustrated in FIG. 15. The latter contains an example for the case n=5. The slope of the diagonal in this case is more pronounced, because it is due to the shifting of each column of cells with respect to its neighbours. Such a grid consequently contains $2n^2-n$ cells distributed in the following way:

| Number of Cells | Type of Cells |
|---|---|
| n(n−1)/2 | input retiming or (ir) |
| n−1 | diagonal or (d) |
| 1 | bottom end of diagonal or (fd) |
| n−1 | ends above the diagonal or (fad) |
| (n−2)(n−1)/2 | above diagonal or (ad) |
| n(n−1) | output retiming or (or). |

The lower limit of the clock period of the circuit of this device is $$\tau > \max\{\tau_{mux}+\tau_{add}, \tau'_{prop}\} \quad (7)$$

in which $\tau'_{prop}$ is the propagation time of a signal along the longest wire among the cells ir, d, fd, fad, ad or or of FIG. 15. There is no longer any dependence of this limit on the bit width of the circuit.

The full adders of FIG. 2 can be generalized to the logic units of FIG. 15. Each unit to the left, referred to as a generalized adder, receives j+k+l input bits and produces k+l output bits. In this case j, k and l can be any random non-negative integer. In mathematical notation, if f represents the logic function performed by this unit, it is possible to write:

$$(d_0, \ldots, d_{l-1}, e_0, \ldots, e_{k-1}) = f(a_0, \ldots, a_{j-1}, b_0, \ldots, b_{k-1}, c_0, \ldots, c_{l-1})$$

Figure 16:
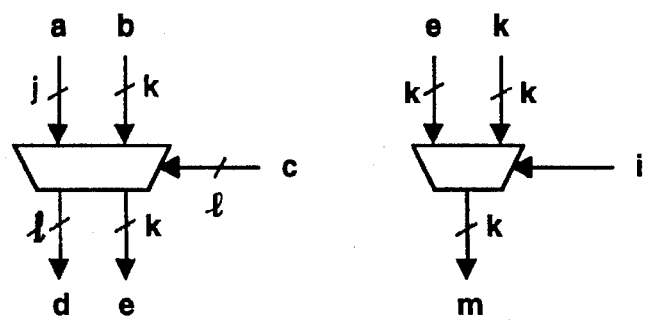
FIG. 16 shows a general structure of a circuit using the logic units of FIG. 15.

The outputs $d_0, \ldots, d_{l-1}$ are referred to as the generalized carries of this unit. FIG. 16 shows the general structure of a circuit using these units.

In the preceding paragraphs consideration has been given to a circuit having the structure of FIG. 16, where f has been the full adder function with j=k=l=1. However, nothing in our technique requires f to have any particular function (or the same function for each circuit column).

Figure 17:
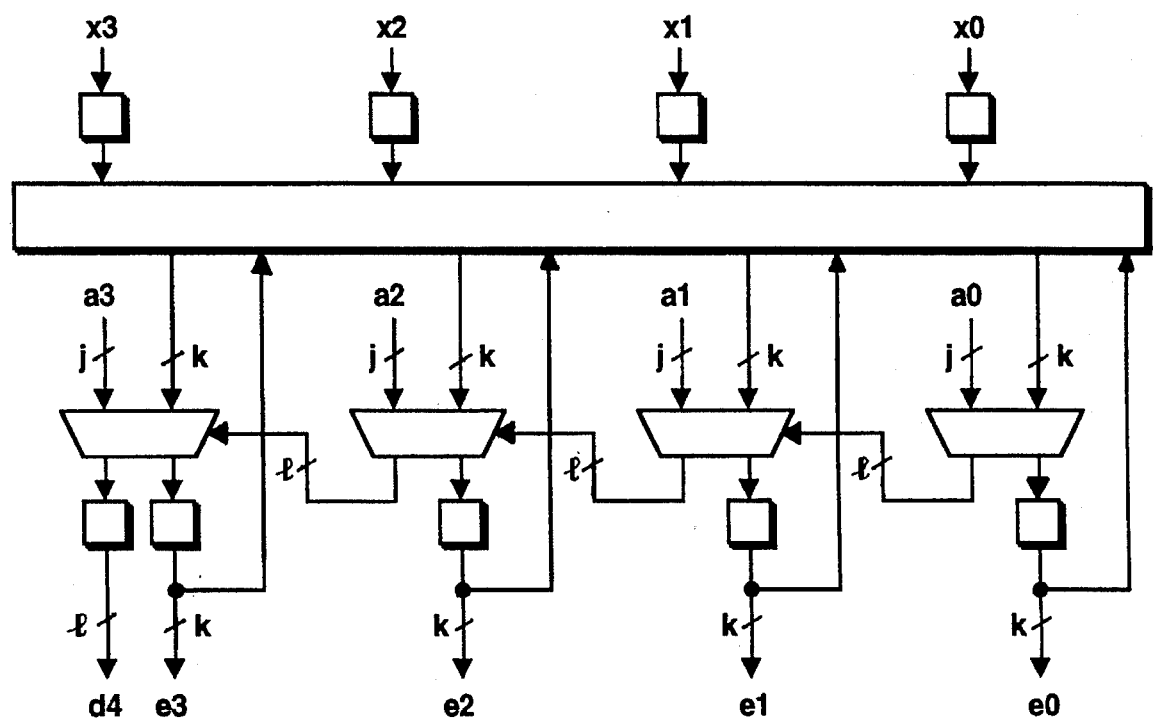
FIG. 17 shows four logic units/adders used in a circuit.

With a circuit having the structure of FIG. 17, in which the generalized carry propagation direction is the same as the shift direction of the shifter, it is possible to use the preceding devices for obtaining high speed operational circuits. $\tau_{agen}$ is the setting time of a generalized adder, $\tau_{mgen}$ the setting time of a generalized multiplexer and $S_{max}$ the maximum shift. The lower limit of the clock period is obtained $$\tau > \max\{\tau_{mgen}+\tau_{agen}, S_{max} \cdot \tau_{prop}\}$$

by the device of FIG. 9 and $$\tau > \max\{\tau_{mgen}+\tau_{agen}, \tau'_{prop}\}$$

by the device of FIG. 15.

We claim:

1. Code point update device for an arithmetic coding system comprises:

an $n^2$ circuit array, said $n^2$ circuit array comprised of an $n^2$ number of array cells;

a first n(n−1)/2 portion of said $n^2$ number of array cells being disposed above a principal diagonal of said array, said first portion designated "ad" cells, each of said "ad" cells incorporating a first multiplexer, a second n−1 portion of said $n^2$ number of array cells being disposed on said principal diagonal, said second portion designated "d" cells, each of said "d" cells incorporating a first adder, a second multiplexer, and at least one register associated with said second portion, a third single cell portion of said $n^2$ number of array cells being disposed at the bottom end of the diagonal, said third portion designated "fd" cell, said "fd" cell incorporating a second adder, a third multiplexer, and at least one register associated with said third portion, a fourth n(n−1)/2 output retiming cells portion of said $n^2$ number of array cells, said fourth portion designated "or" cells, said "or" cells incorporating a register associated with said fourth portion, wherein said first, second, and third multiplexers and said first and second adders are associated with a clock period, a lower limit of the clock period corresponding to $$\tau \geq \max\{\tau_{mux}+\tau_{add}, X_{max} \tau_{prop}\}$$

where $\tau_{mux}$ and $\tau_{add}$ correspond to the set-up times of the first, second, and third multiplexers and said first and second adders, respectively, and where $\tau_{prop}$ corresponds to the time lag necessary to enable a signal to propagate through a width of a cell and wherein a quantity $X_{max}$ represents a maximum shift of an input X with respect to a starting value of input X.

2. Device according to claim 1, characterized in that said first and second adders are generalized adders, each generalized adder having j+k+l input bits and generating l+k output bits, wherein j, k and l are non-negative integers.

3. A code point update device according to claim 1 wherein said "ad" cells further comprise a first retiming register disposed to delay a signal propagated from an adjacent cell disposed along a common rank of said "ad" cells.

4. A code point update device according to claim 1 wherein a second and succeeding ones of said "d" cells further comprise at least one retiming register disposed to delay a signal propagated from a first and corresponding succeeding ones of said "d" cells.

5. A code point update device according to claim 1 further comprising a plurality of input retiming registers disposed to delay input signals fed to said array, said plurality of input retiming registers arranged to provide a first delay for a second one of said array cells with successively increasing delays for a third and succeeding ones of said array cells.

6. A code point update device according to claim 1 further comprising a plurality of output retiming registers disposed to delay output signals received from said array, said plurality of output retiming registers arranged to provide a first delay for a cell preceding a last one of said array cells with successively increasing delays for a second one of said cells preceding said last one of said array cells and preceding ones of said array cells.

7. A code point update device according to claim 1 further comprising a first plurality of retiming registers disposed to delay a signal propagated from an adjacent cell disposed along a common rank of said "ad" cells;

a second plurality of retiming registers wherein a second and succeeding ones of said "d" cells further comprising at least one of said second plurality of retiming registers disposed to delay a signal propagated from a first and corresponding succeeding ones of said "d" cells;

a third plurality of input retiming registers disposed to delay input signals fed to said array, said plurality of input retiming registers arranged to provide a first delay for a second one of said array cells with successively increasing delays for a third and succeeding ones of said array cells; and a fourth plurality of output retiming registers disposed to delay output signals received from said array, said plurality of output retiming registers arranged to provide a first delay for a cell preceding a last one of said array cells with successively increasing delays for a second one of said cells preceding said last one of said array cells and preceding ones of said array cells.

8. Code point update of an arithmetic coding system, characterized in that it comprises:

a (2n−1)n circuit array, said (2n−1)n circuit array comprised of (2n−1)n number of array cells;

a first n(n−1)/2 input retiming cells portion of said (2n−1)n number of cells, said first portion designated "ir", said "ir" cells incorporating a first and second register, a second n−1 portion of said (2n−1)n number of array cells, said second portion designated "d" cells, said "d" cells incorporating a first adder and a first multiplexer, a third final diagonal cell portion of said (2n−1)n number of array cells being disposed at the lower end of the diagonal, said third portion designated "fd" cell, said "fd" cell incorporating a second adder and a second multiplexer, a fourth n−1 portion of said (2n−1)n number of array cells disposed above a diagonal in a lefthand column of said array, said fourth portion designated "fad" cells, said "fad" cells incorporating a third multiplexer, a fifth (n−2)(n−1)/2 portion of said (2n−1)n number of array cells disposed above a diagonal, said fifth portion designated "ad" cells, said "ad" cells incorporating a fourth multiplexer, a sixth n(n−1) output retiming cells portion of said (2n−1)n number of array cells, said sixth portion designated "or" cells, said "or" cells incorporating a register associated with said sixth portion, wherein said first, second, third, and fourth multiplexers and said first and second adders being associated with a clock period, a lower limit of the clock period corresponding to $$\tau \geq \max \{\tau_{mux} + \tau_{add}, \tau'_{prop}\}$$

where $\tau_{mux}$ and $\tau_{add}$ are the set-up times of the first, second, third, and fourth multiplexers and said first and second adders, and where $\tau'_{prop}$ is the propagation time of a signal along the longest wires from among said cells "ir", "d", "fd", "fad", "ad" or "or".

9. Device according to claim 8, characterized in that said first and second adders are generalized adders, each generalized adder having j+k+l input bits and generating l+k output bits, wherein j, k and l are non-negative integers.

* * * * *